United States Patent
Kulkarni et al.

(10) Patent No.: US 10,074,591 B1
(45) Date of Patent: Sep. 11, 2018

(54) SYSTEM WITH PROVISION OF A THERMAL INTERFACE TO A PRINTED CIRCUIT BOARD

(71) Applicant: Intel Corporation, Santa Clara, CA (US)

(72) Inventors: Devdatta P. Kulkarni, Portland, OR (US); Russell S. Aoki, Tacoma, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/448,120

(22) Filed: Mar. 2, 2017

(51) Int. Cl.
| | |
|---|---|
| *H01L 23/427* | (2006.01) |
| *F28D 15/02* | (2006.01) |
| *H05K 1/02* | (2006.01) |
| *H05K 1/18* | (2006.01) |
| *H05K 3/22* | (2006.01) |
| *H05K 3/30* | (2006.01) |
| *H01L 23/32* | (2006.01) |

(52) U.S. Cl.
CPC ........ *H01L 23/427* (2013.01); *F28D 15/0275* (2013.01); *H01L 23/32* (2013.01); *H05K 1/0203* (2013.01); *H05K 1/181* (2013.01); *H05K 3/22* (2013.01); *H05K 3/303* (2013.01); *F28D 15/0266* (2013.01); *H05K 2201/064* (2013.01); *H05K 2201/066* (2013.01); *H05K 2201/10378* (2013.01)

(58) Field of Classification Search
CPC ......... H01L 23/427; H01L 2224/48227; H01L 2924/014; H01L 2924/14; H01L 2225/06589; H01L 23/32; F28D 15/0266; F28D 15/0275; F28D 15/04; H05K 1/0203; H05K 3/0061; H05K 7/20336; H05K 3/22; H05K 1/181; H05K 3/303; H05K 2201/10378; H05K 2201/066; H05K 2201/064
See application file for complete search history.

(56) References Cited

U.S. PATENT DOCUMENTS

| | | | | |
|---|---|---|---|---|
| 3,582,610 | A * | 6/1971 | Eckles | B23K 1/0053 219/209 |
| 6,065,664 | A * | 5/2000 | Garner | B21D 39/06 228/126 |
| 2005/0077617 | A1 * | 4/2005 | Hirano | H01L 23/4334 257/712 |
| 2005/0211752 | A1 * | 9/2005 | Hurley | B23K 31/02 228/245 |

(Continued)

*Primary Examiner* — Adam B Dravininkas
(74) *Attorney, Agent, or Firm* — Schwabe, Williamson & Wyatt, P.C.

(57) ABSTRACT

Embodiments of the present disclosure provide techniques and configurations for providing a thermal interface to a PCB. In some embodiments, the system for providing a thermal interface to a PCB may include a heat sink couplable to a printed circuit board (PCB) via a thermal interface. The heat sink may include a base configured to accommodate a plurality of heat pipes. The system may further include a heater block couplable to the base with the plurality of heat pipes, to conduct heat generated by the heater block to the base via the plurality of heat pipes, to heat the thermal interface, and cause the thermal interface to spread substantially evenly between the heat sink and the PCB. Other embodiments may be described and/or claimed.

15 Claims, 8 Drawing Sheets

(56) References Cited

U.S. PATENT DOCUMENTS

| | | | | |
|---|---|---|---|---|
| 2005/0274120 A1* | 12/2005 | Quisenberry | ......... | F28D 15/0233 |
| | | | | 62/3.7 |
| 2006/0060328 A1* | 3/2006 | Ewes | ............... | H01L 23/427 |
| | | | | 165/80.2 |
| 2006/0063310 A1* | 3/2006 | Jadhav | ............. | H01L 21/563 |
| | | | | 438/122 |
| 2006/0087816 A1* | 4/2006 | Ewes | ................. | F28F 3/02 |
| | | | | 361/704 |
| 2009/0260782 A1* | 10/2009 | Whitney | ........... | B21D 53/02 |
| | | | | 165/104.21 |
| 2013/0027888 A1* | 1/2013 | Yoshida | ............ | H01L 23/24 |
| | | | | 361/715 |

* cited by examiner

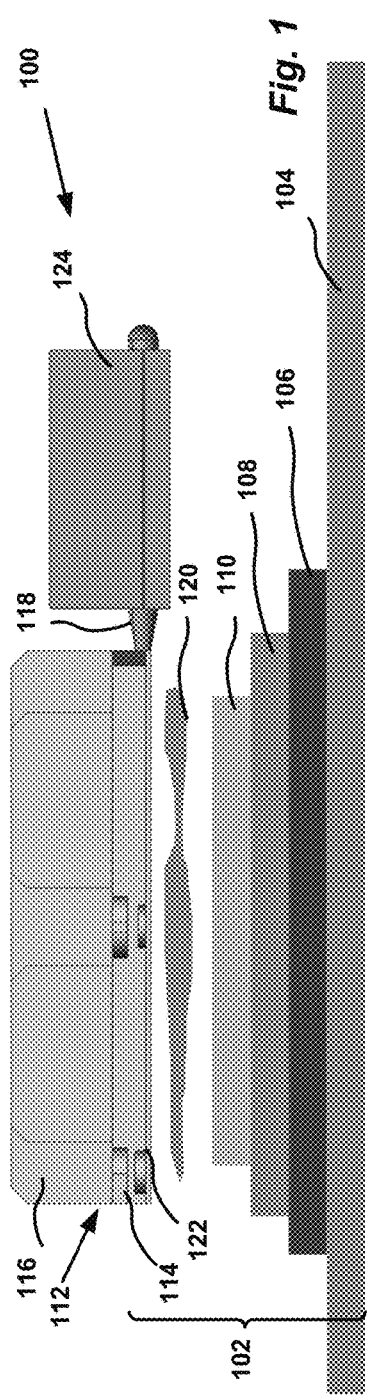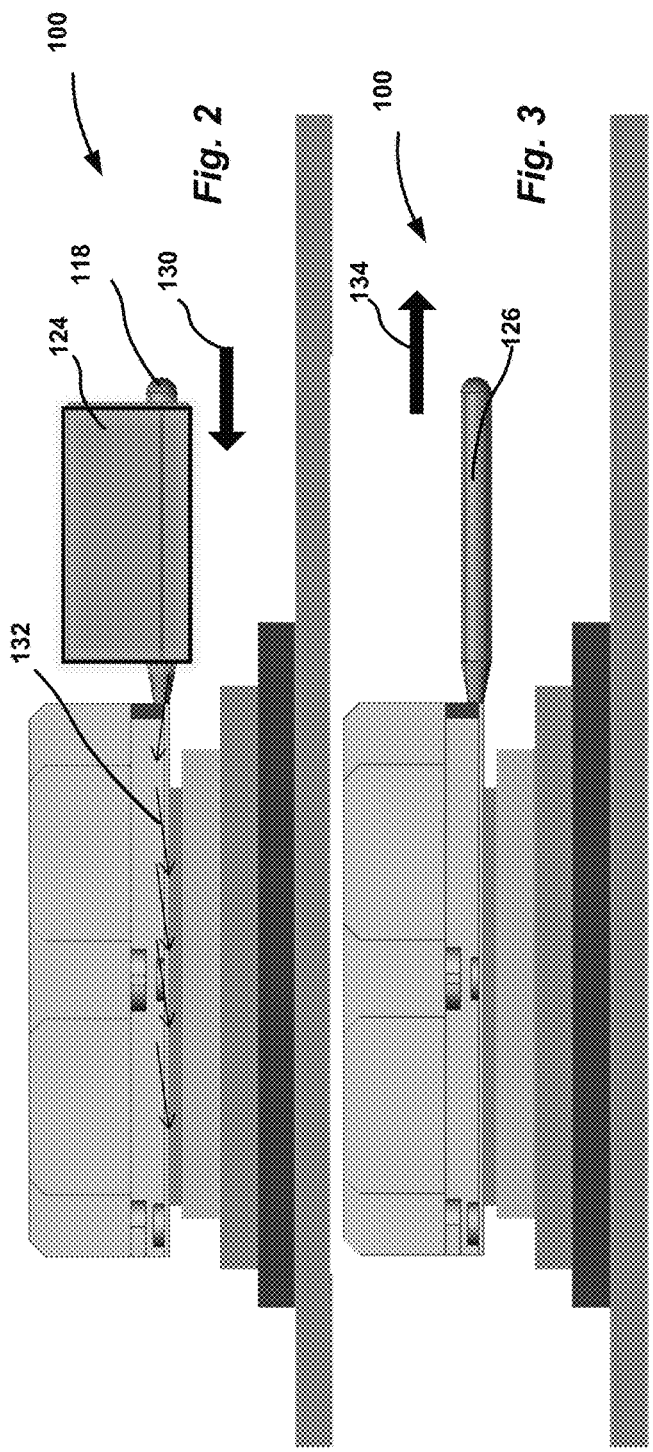

SYSTEM WITH PROVISION OF A THERMAL INTERFACE TO A PRINTED CIRCUIT BOARD

FIELD

Embodiments of the present disclosure generally relate to the field of printed circuit board fabrication and in particular to thermal interfaces in printed circuit boards.

BACKGROUND

Currently produced integrated circuits (IC), such as processors, demand higher power due to an increase in core counts, performance, and integration of multiple dies. This high power may translate to higher heat density on the dies and packages and require better thermal solutions to cool them. The keep out zones for placing the thermal solutions (e.g., heat sinks) on printed circuit boards (PCB) may be very limited, and boundary conditions may be well defined and bounded by American Society of Heating, Refrigerating and Air-Conditioning Engineers (ASHRAE) guidelines. The cost limitation may also be critical to a design of new thermal technologies. All these parameters may put a substantial burden on designs of efficient thermal solutions.

Current thermal solutions for dissipation of the heat generated by an IC (e.g., a processor) involve using a thermal interface between the processor and the thermal solution (e.g., heat sink). A thermal interface may comprise a thermal interface material (TIM). Typically, a TIM may be placed between an integrated heat spreader (IHS) of the processor and the heat dissipation device (e.g. the heat sink). However, thermal resistance of a thermal interface material in thermal solutions may become problematic in some instances. For example, for the processors, whose die power exceeds 200 W, the temperature difference across the TIM may vary between 10 degrees to 12 degrees Celsius. At the same time, a reduction in the processor temperature (even by one degree), if achieved, may result in a high gain and increased performance of the processor.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 1-3 illustrate an example system with provision of a thermal interface to a printed circuit board (PCB) assembly, in accordance with some embodiments.

DETAILED DESCRIPTION

Figure 4:
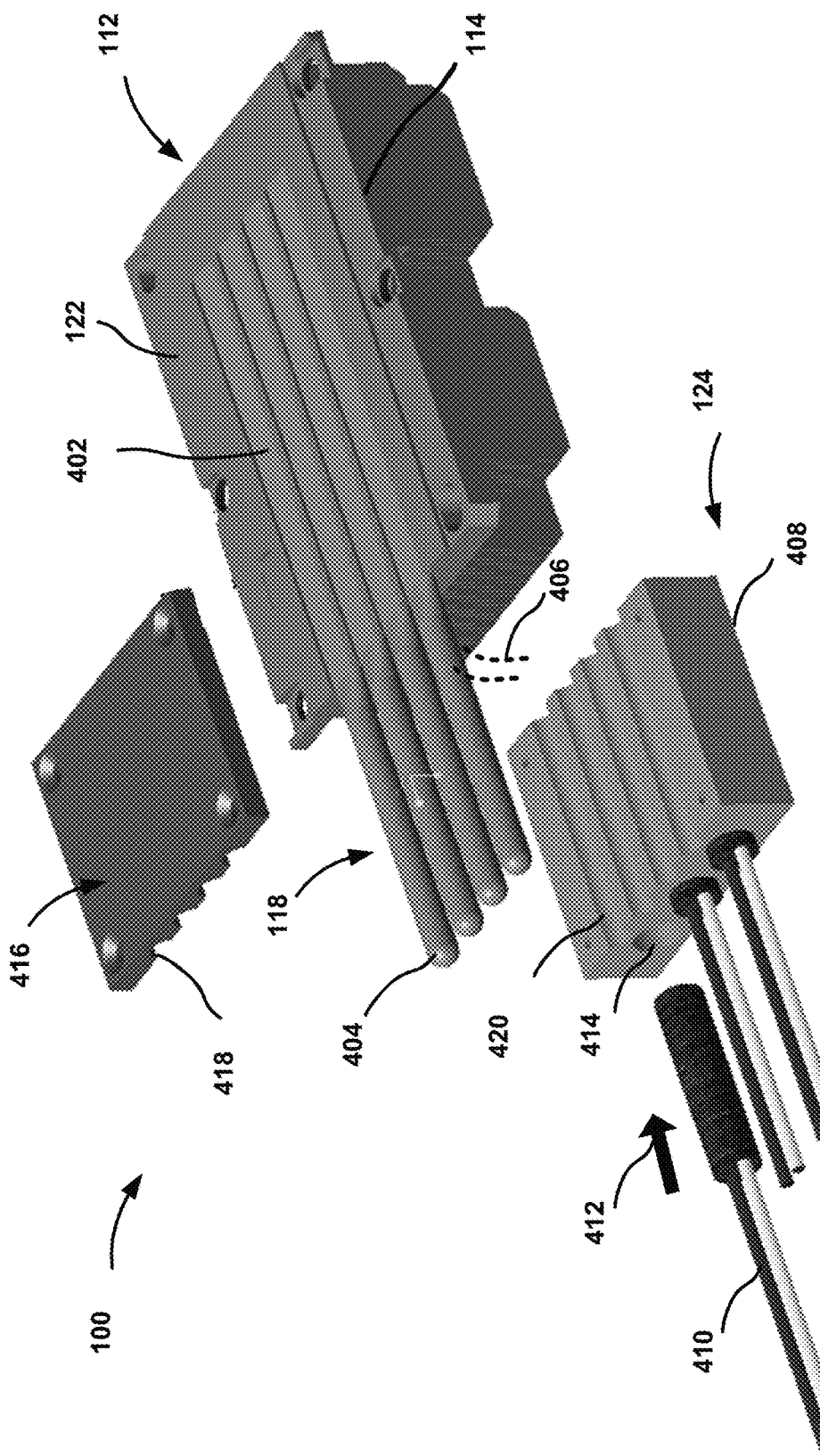
FIG. 4 illustrates some example components of the system of FIGS. 1-3, in accordance with some embodiments.

Embodiments of the present disclosure include techniques and configurations for providing a thermal interface to a PCB. In some embodiments, the system may include a heat sink couplable to a printed circuit board (PCB) via a thermal interface. The heat sink may include a base configured to accommodate a plurality of heat pipes. The system may further include a heater block couplable to the base with the plurality of heat pipes, to conduct heat generated by the heater block to the base via the plurality of heat pipes, to heat the thermal interface, and cause the thermal interface to spread substantially evenly between the heat sink and the PCB.

In the following detailed description, reference is made to the accompanying drawings that form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), (A) or (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

FIGS. 1-3 illustrate an example system with provision of a thermal interface to a PCB assembly, in accordance with some embodiments. More specifically, FIGS. 1-3 illustrate the system 100 in various stages of provision of the thermal interface to a PCB assembly 102. For ease of understanding, like components of FIGS. 1-3 are indicated by like numerals.

In embodiments, the PCB assembly 102 may include a PCB 104 (e.g., a motherboard), a portion of which is shown in FIGS. 1-3. An integrated circuit (IC), such as a central processing unit (CPU) or memory unit, may be disposed on the PCB 104, using a socket 106 (e.g., CPU socket). For example, an IC (e.g., CPU) may be placed inside a socket. For this purpose, the socket 106 may be mounted on the PCB 104, as shown.

A substrate 108 may be provided in the socket 106 for an IC, such as a CPU (not shown). In embodiments, the IC, such as CPU, may have an integrated heat spreader (IHS) disposed on a substrate, to provide an outlet for heat that may be dissipated by the CPU (or other IC) during operation. For ease of explanation, the IC die with IHS disposed on it will be indicated hereinafter as IHS 110. The PCB assembly 102 may further include, or couple with, a thermal solution to provide dissipation of heat produced by the CPU or other IC. In embodiments, such solution may include a heat sink 112 with a base 114 and a heat exchanger 116 disposed on top of the base 114. In some embodiments, in order to provide efficient heat dissipation, the CPU (or other type of IC) placed in the socket 106 may be thermally coupled with the heat sink 112 via the IHS 110 and a thermal interface 120.

In embodiments, the thermal interface 120 may comprise a thermal interface material (TIM), such as, for example, a high thermal conductive paste. The thermal interface 120 may act as filler when two objects with substantially flat surfaces (e.g., IHS and a bottom surface 122 of the base 114) are to make contact in response to attachment of the heat sink 112 to the PCB assembly 102. In some instances, the contact between the base 114 and IHS 110 may include unevenness and air pockets trapped between the two surfaces, which may impede the heat transfer between the IHS 110 and the heat sink 112.

The thermal interface 120 may be used to improve the heat conductivity between the IHS 110 and the heat sink 112, e.g., by reducing thermal resistance between the PCB 102 and the heat sink 112. Accordingly, the thermal interface material (e.g., thermal conductive solder paste TIM2, such as Alpha OM-535) may be applied to the bottom surface 122 of the base 114 of the heat sink 112, or to the IHS 110. Then, the heat sink 112 may be attached to the PCB 104. Subsequently, the thermal interface 120 may be heated and soldered between the heat sink base 114 and the IHS 110. As a result, the thermal interface 120 may be spread substantially evenly between the bottom surface 122 of the base 114 and the IHS 110, reducing the thermal resistance between the heat sink 112 and the PCB 104. The embodiments described herein may provide for provision of heat to the thermal interface 120 using an external heat source, as described below in detail.

In embodiments, the base 114 may be configured to accommodate (e.g., receive and/or include) a plurality of heat pipes 118, in order to provide heat to the thermal interface 120. For example, the heat pipes 118 may be distributed around the bottom surface 122 of the base 114 in various ways.

As shown in FIGS. 1-2, once the heat sink 112 is installed on the PCB 104, an external removable heater block 124 may be attached to the heat sink 112, as indicated by arrow 130. In embodiments, the heater block may be configured to couple to (e.g., attach to) the heat pipes 118. As described below, in some embodiments, the heat pipes 118 may be removably attachable to the base 114. In some embodiments, the heat pipes 118 may be attached to (embedded in) the base 114.

In some embodiments, as shown in FIG. 3, the heat pipes 118 may be embedded in the base 114, and may have respective extended portions 126 that may extend out of the base 114 (and away from the keep out zone of the PCB 104). Thus, the heater block 124 may be removably attachable to the base 114 via the extended portions 126 of the heat pipes 118.

In some embodiments described below, the heat pipes 118 may be attached to the heater block 124, and may include respective extended portions that may extend out of the heater block 124. The heater block 124 may be removably attachable to the base 114 via the extended portions of the heat pipes 118, which may be received by the base 114 (e.g., in response to insertion of the extended portions of the heat pipes 118 into the base 114).

The heater block 124 may include embedded (or removable) heater elements (e.g., cartridges, not shown in FIGS. 1-3). The cartridges may be energized using an external power supply during installation or removal. Thus, the heater block 124 may generate heat 132, produced by the heater elements. Accordingly, the heat pipes 118 may conduct this heat from the heater block 124 to the thermal interface 120 until the temperature reaches the solder paste melting point and reflows (spreads substantially evenly) between the surface 122 of the base 114 and the IHS 110.

After the solder paste of the thermal interface 120 has been melted and spread, the heater block 124 may be removed, as indicated by arrow 134 in FIG. 3, and the system 100 may be let cool down to achieve soldering of the thermal interface material between the IHS 110 and the heat sink 112.

The described embodiments of provision of the thermal interface for a PCB may have the following advantages, compared to conventional solutions. For example, the total stiffness of the whole PCB assembly may be higher due to soldered parts as described above. Further, the described embodiments may provide for a decrease of the thermal resistance of thermal interface material by application of soldered high thermal conductivity paste (e.g., low temperature soldered material, such as TIM2), for the processors or other IC types.

The described embodiments may provide for soldering of the thermal interface material between the IHS 110 and the heat sink 112 in situ, without any need for heating the whole system 100 with PCB assembly 102 (e.g., in an oven), and make it easier to service the system 100 with PCB assembly 102 when needed, without disrupting manufacturing or validation procedures. The described embodiments may also minimize metal to metal contact resistance and may be used for multi-IHS structures with different heights.

Further, the described embodiments may provide for increase of the die power, achievement of the reliable junction temperature with the same boundary conditions, and for the use of high thermal conductive solder material. The described embodiments may also be used with bare die structures, e.g., without employing IHS.

Further, the embodiments that provide for the heat pipes embedded in the heat sink base may serve to transfer heat from external heat sources (e.g., heater block 124) to the thermal interface 120 for melting the solder material during installation and servicing, and also serve as heat spreaders during normal operating conditions.

In summary, the described embodiments may provide for use of high thermal conductivity soldered material and heat pipes integrated in the base of a thermal solution, to reduce thermal resistance between the thermal solution (e.g., heat sink) and the PCB, and provide for cost savings, compared to conventional solutions.

FIG. 4 illustrates some example components of the system of FIGS. 1-3, in accordance with some embodiments. More specifically, FIG. 4 illustrates perspective views of the heat sink 112 and the heater block 124 of the system 100, in partially assembled states. As described above, the heat pipes 118 may be embedded in the base 114, shown with the surface 122 exposed, for ease of understanding. Respective portions 402 of heat pipes 118 may be disposed in the base 114, while portions 404 (shown in FIG. 3 under numeral 126) may be extended out of the base 114, to reside outside the keep out zone of the heat sink 112. For example, in some embodiments, the portions 402 may be disposed substantially flush with the surface 122 of the base 114. In some embodiments, the portions 402 may have substantially flattened transverse shapes, compared to substantially cylindrical shapes of the extended portions 404.

For ease of understanding, the heat pipes are shown in FIG. 4 as extruding straight out from the edge of the base 114. In some embodiments, the extended portions 404 of the heat pipes 118 may be bent under various angles (as schematically illustrated by dashed curves 406), to keep out of the keep out zones of other components on the PCB (e.g., motherboard), such as voltage regulators, heat sinks, cables, or connectors, depending upon the orientation of the heat sink 112 on the PCB. For example, the heat pipes may be bent up to 90 degrees and moved to a side of the heat sink, and a heater block may be mounted to the heat sink via the heat pipes substantially vertically, relative to a plane of the PCB. In general, there may be several different ways one can install heat pipes to achieve the same result, e.g., transfer of heat to the thermal interface from an external heater block.

As shown, the heater block 124 may include a bottom portion 408. The bottom portion 408 may be configured to receive cartridge heaters 410, which may be insertable 412 inside respective receptors 414 (e.g., apertures) provided in the bottom portion 408. The heater block 124 may further include a top portion 416, couplable with the bottom portion 408, to receive the extended portions 404 of the heat pipes 118. As shown, the top portion 416 and bottom portion 408, when coupled together, may form receptors (e.g., through holes defined by respective grooves 418 and 420), to receive respective extended portions of the heat pipes 118.

Figure 5:
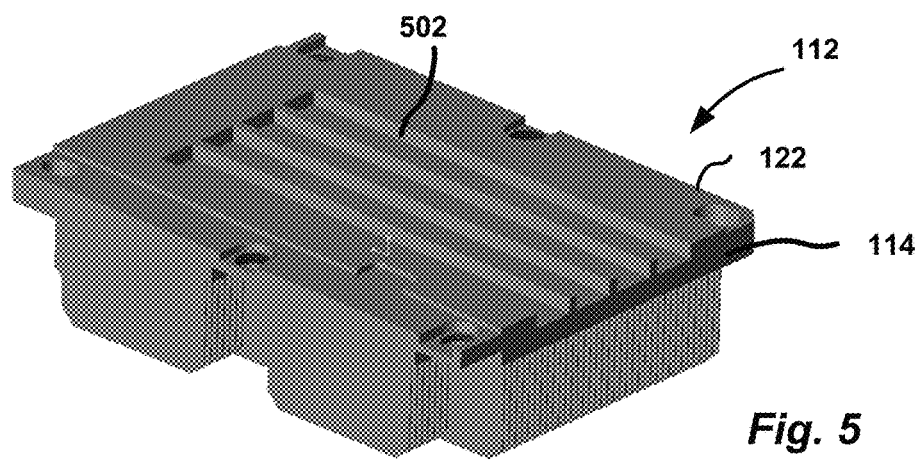
FIGS. 5-7 illustrate perspective views of some components of the system of FIGS. 1-4 in various stages of assembly, in accordance with some embodiments.
Figure 6:
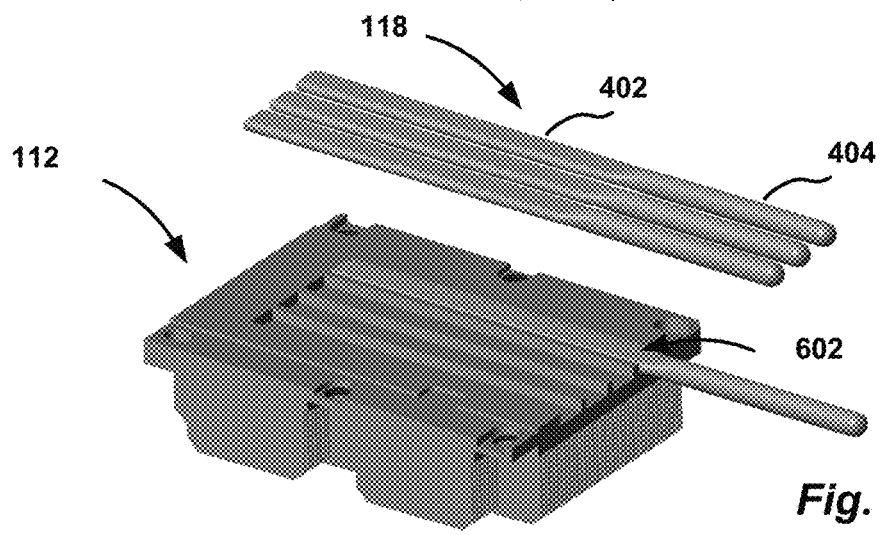
Figure 7:
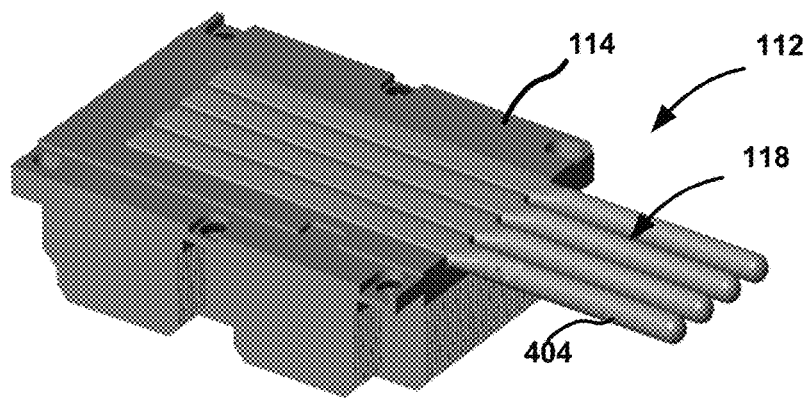

FIGS. 5-7 illustrate perspective views of some components of the system of FIGS. 1-4 in various stages of assembly, in accordance with some embodiments. For ease of understanding, the like components of FIGS. 1-4 and 5-7 are enumerated with like numerals.

FIG. 5 illustrates the heat sink 112 before the heat pipes 118 may be attached to the base 114. The heat sink 112 is shown in FIGS. 5-7 with its surface 122 exposed for ease of understanding. Accordingly, the surface 122 may face the thermal interface 120, in response to attachment of the heat sink 112 to a PCB (not shown).

As shown, the base 114 may include multiple receptors 502 (e.g., grooves) provided on the surface 122 of the base 114, to receive the portions 402 of the heat pipes 118. In some embodiments, the receptors 502 may comprise holes or apertures disposed in the base 114, to receive the portions 402 of the heat pipes 118.

FIG. 6 illustrates the heat sink 112 after some of the heat pipes 118 may be attached 602 to the base 114. As may be seen in FIG. 6, the portions 402 of the heat pipes 118 may have somewhat flattened shapes, compared to the portions 404, in order to fit into the receptors 502.

FIG. 7 illustrates the heat sink 112 with the heat pipes 118 attached to the base 114. As described above, the portions 404 may extend out of the heat sink 112, to couple to the heater block (not shown).

Figure 8:
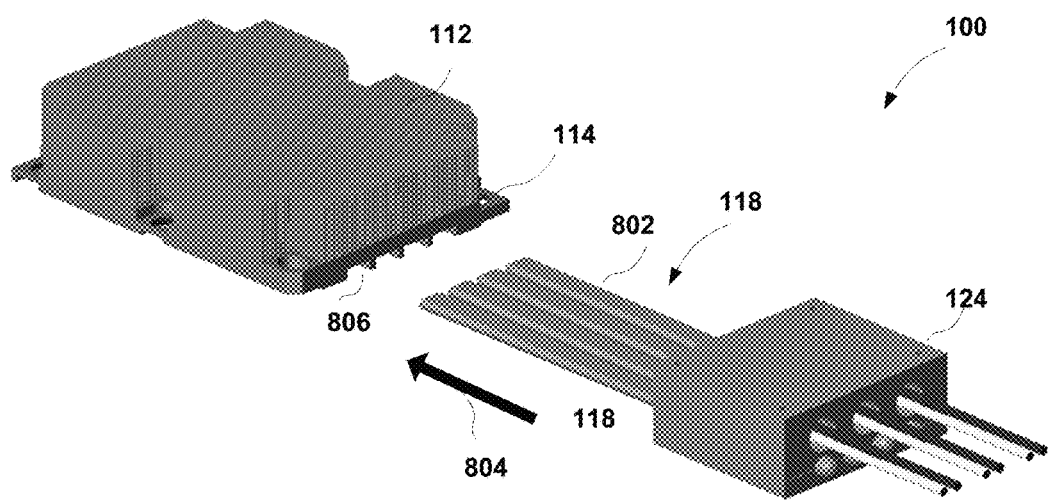
FIG. 8 illustrates a perspective view of an example system for provision of heat to a thermal interface of a PCB, in partially assembled state, in accordance with some embodiments.

FIG. 8 illustrates a perspective view of an example system for provision of heat to a thermal interface of a PCB, in partially assembled state, in accordance with some embodiments. In the embodiments illustrated in FIG. 8, the heat pipes 118 may be attached to the heater block 124 of the system 100, as shown. For example, the heat pipes 118 may be embedded in the heater block 124, using receptors similar to ones described in reference to the heat sink in FIG. 5. As shown, the heat pipes 118 may have respective extended portions 802 that may extend out of the heater block 124, to be received by the base 114 of the heat sink 112, in response to insertion 804 of the pipes 118 in respective receptors 806 disposed in the base 114. Accordingly, the heater block 124 may be removably attachable to the base 114 via the extended portions 802 of the heat pipes 118. As shown, the portions 802 may be partially flattened, to fit into respective receptors 806.

Figure 9:
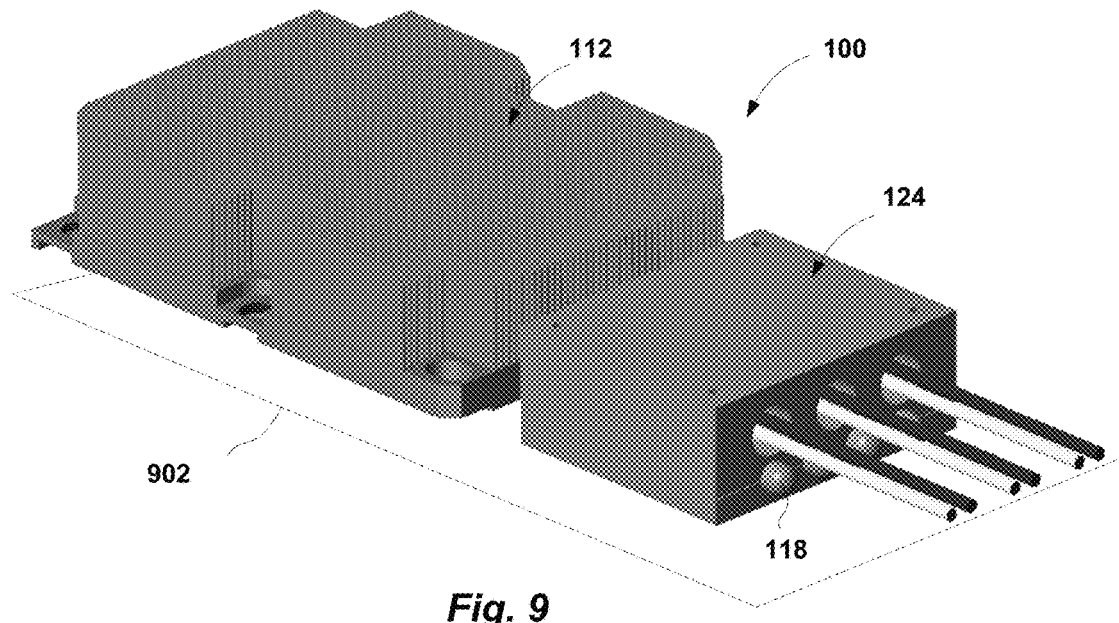
FIGS. 9-10 illustrate perspective views of an example system for provision of heat to a thermal interface of a PCB in a fully assembled state, in accordance with some embodiments.
Figure 10:
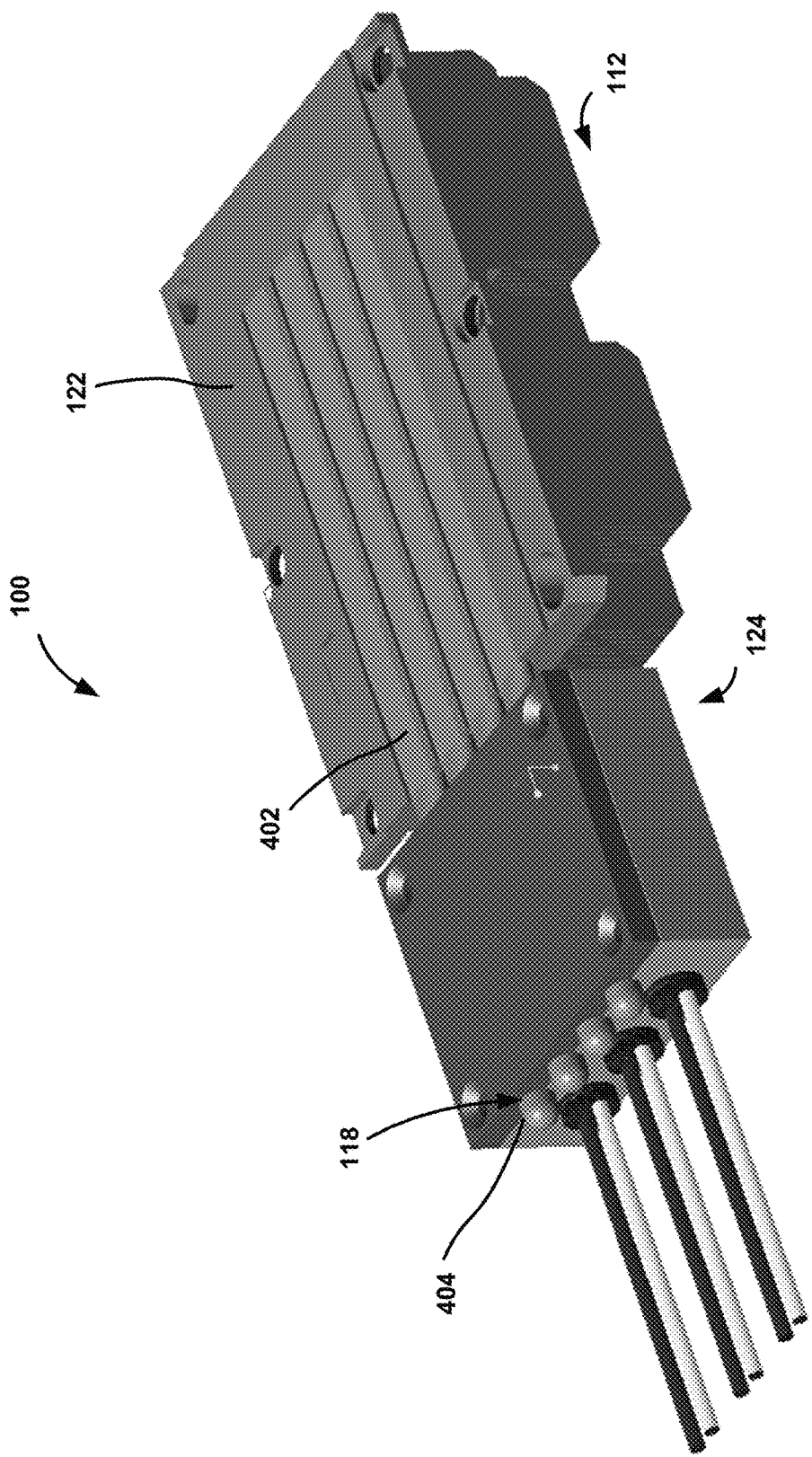

FIGS. 9-10 illustrate perspective views of an example system for provision of heat to a thermal interface of a PCB in a fully assembled state, in accordance with some embodiments.

More specifically, FIG. 9 illustrates a perspective view of the system 100 having the heat sink 112 and the heater block 124 attached to the heat sink 112. In this assembled state, the system 100 may be attached to a PCB, e.g., motherboard, schematically indicated by dashed lines 902. For example, once the processor and heat sink are installed in the socket on the PCB, e.g., using a processor heat sink loading mechanism retention and with the thermal interface, such as a solder paste (e.g., TIM2), the heat sink 112 may be coupled with the heater block 124, resulting in a heat sink assembly with provision of a thermal interface.

FIG. 10 illustrates another perspective view of the system 100, showing the heat sink 112 with the exposed surface 122 of the base 114, and the heater block 124 with the exposed bottom portion 408 of the heater block 124, for ease of understanding. As discussed above, in some embodiments, the pipes 118 may be attached to (embedded in) the sink 112, and may be couplable to the heater block 124. In some embodiments, the pipes 118 may be attached to (embedded in) the heater block 124, and may be couplable to the sink 112. As discussed above, the pipes 118 may comprise the portion 404 of a substantially cylindrical shape, and the portion 402 of a substantially flattened shape, to fit in respective receptors of the heater block 124 and the heat sink 112.

In the embodiments of the system described above, a heater block of a system may be attached to a base of a heat sink with heat pipes. In some embodiments, the system may include a heater block that may be attachable to other portions of a heat sink, for example, to a heat exchanger, as described in reference to FIGS. 11-13.

Figure 11:
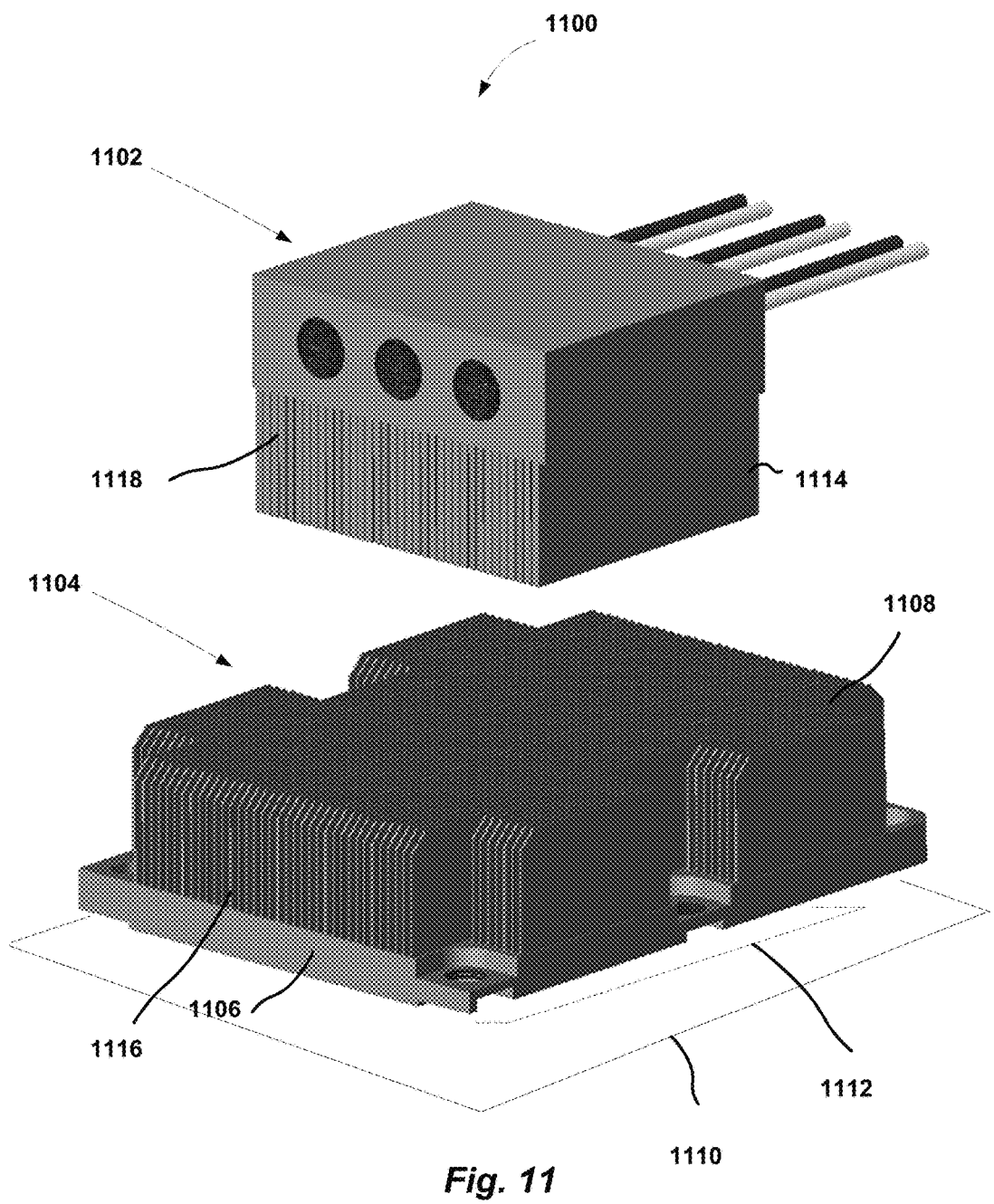
FIGS. 11-13 illustrate another example system for provision of heat to a thermal interface of a PCB, in accordance with some embodiments.
Figure 12:
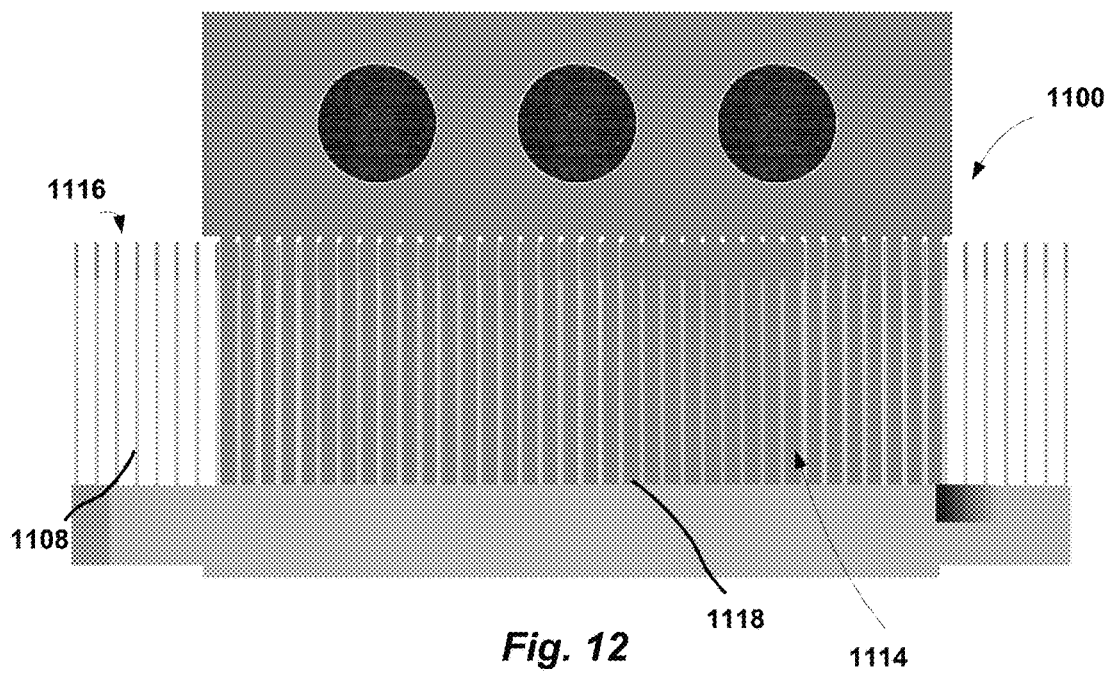
Figure 13:
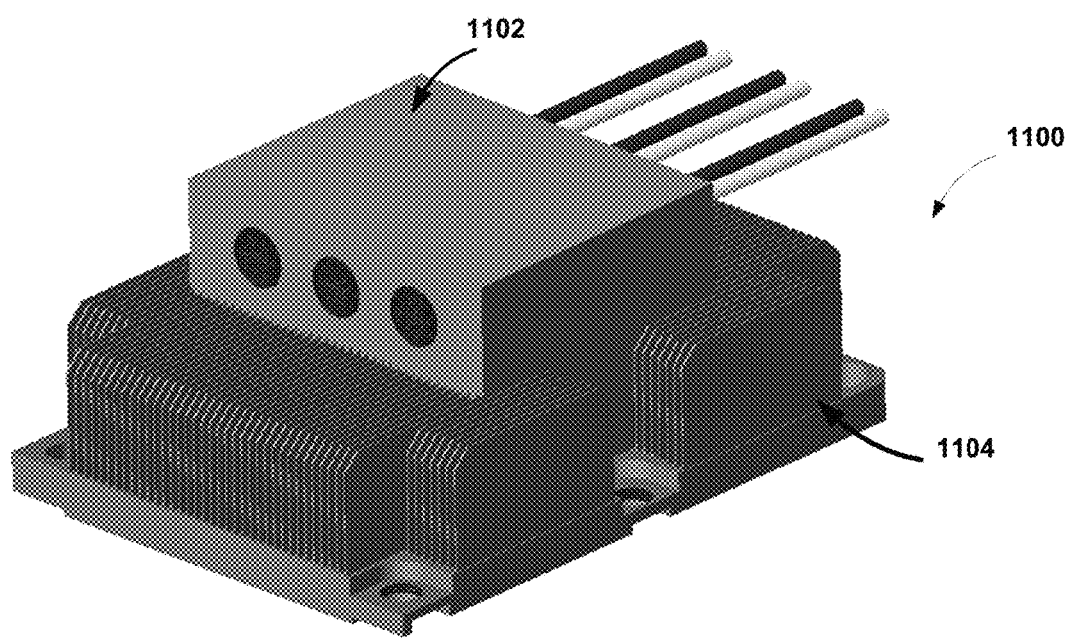

FIGS. 11-13 illustrate another example system for provision of heat to a thermal interface of a PCB, in accordance with some embodiments.

FIG. 11 illustrates a perspective view of an example system for provision of heat to a thermal interface in a disassembled state, in accordance with some embodiments. As shown, the system 1100 may include a heater block 1102, and a heat sink 1104. The system 1100 may be couplable to a PCB 1110 via a thermal interface (schematically indicated by 1112), as described in reference to FIGS. 1-3. The heat sink 1104 may include a base 1106 and a heat exchanger 1108 disposed on the base 1106. The heater block 1102 may include a heat conductive component 1114 couplable with the heat exchanger 1108 of the heat sink 1104, configured to conduct heat generated by the heater block 1102 to the base 1106, in order to heat the thermal interface 1112 (similar to 120 of FIGS. 1-3), and cause the thermal interface 1112 to spread substantially evenly between the heat sink 1104 and the PCB 1110.

As shown, the heat exchanger 1108 may comprise a plurality of fins 1116, for heat dissipation. In embodiments, the heat conductive component 1114 of the heater block 1102 may also comprise a plurality of fins 1118, which may be configured to receive the first plurality of fins, in response to attachment of the heater block 1102 to the heat sink 1104. In other words, the fins 1118 may be insertable between spaces formed between the fins 1116, when the heater block 1102 is attached to the heat sink 1104.

In some embodiments, the heat exchanger 1108 may comprise multiple pins configured to dissipate heat from the PCB 1110. Accordingly, the heat conductive component 1114 of the heater block 1102 may include a corresponding plurality of pins, which may be arranged to interact with the pins of the heat exchanger, in response to attachment of the heater block 1102 to the heat sink 1104.

In the embodiments described herein, the heat conductive component 1114 may transfer heat provided by the heater block 1102, to the base 1106, for heating the thermal interface 1112. The fins 1118 (or pins, not shown) may serve as heat conduits to provide heat to the base 1106.

FIGS. 12-13 illustrate the system of FIG. 11 in an assembled state, in accordance with some embodiments. FIG. 12 provides a side view, and FIG. 13 provides a perspective view of the system 1100 of FIG. 11. As shown, the fins 1118 of the heat conductive component 1114 of the heater block 1102 may be insertable into respective spaces between the fins 1116 of the heat exchanger 1108 of the heat sink 1104.

The attachment of the heater block 1102 to the base 1106 may be done in a number of different ways, other than the ones described in reference to FIGS. 11-13. Further, the heat conductive component 1114 may be provided in a number of different shapes, to conduct heat from the heater block 1102 to the base 1106. The embodiments involving fins or pins described herein are not limiting this disclosure and are provided for purposes of explanation.

Figure 14:
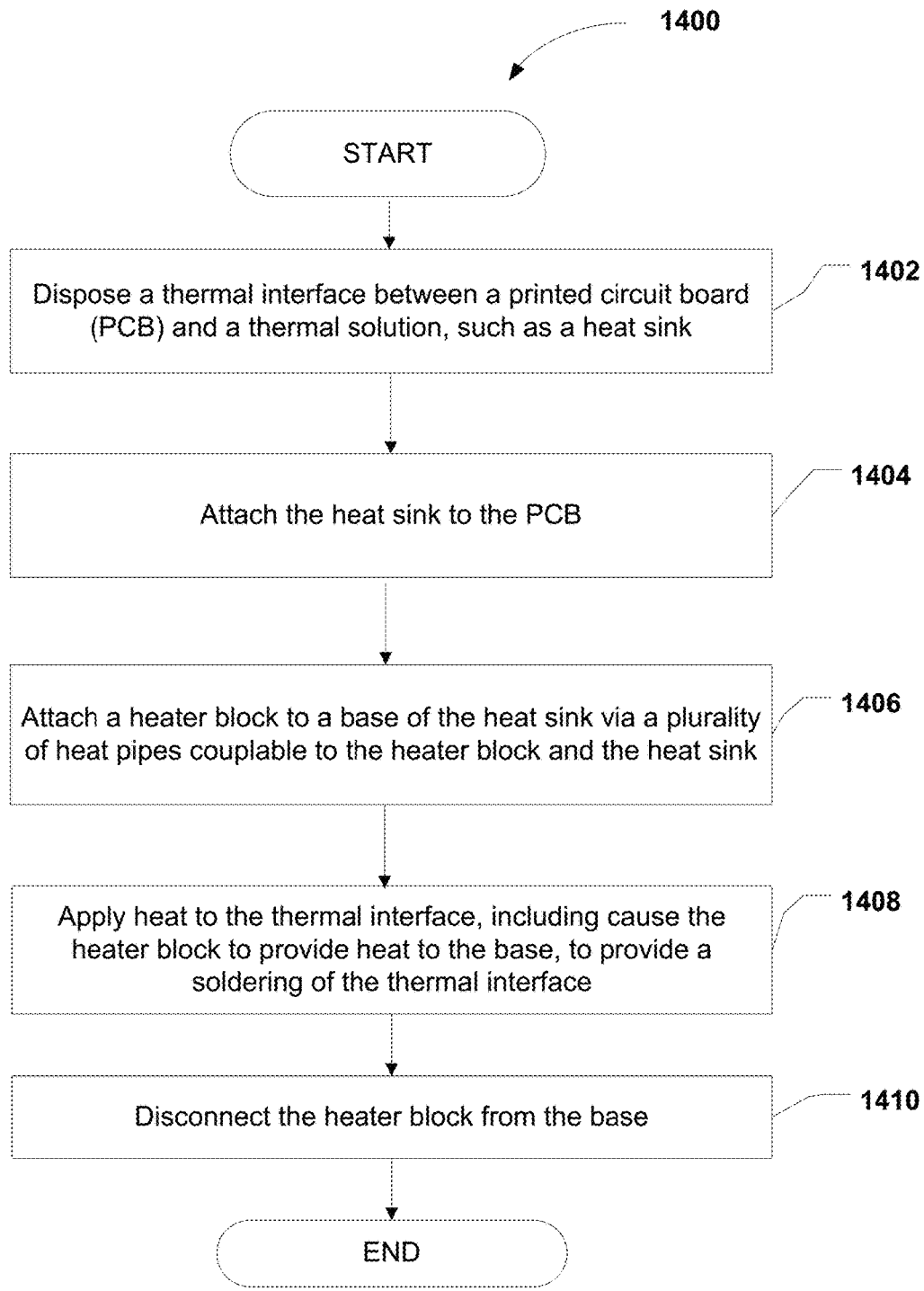
FIG. 14 is an example process flow diagram for providing a thermal interface for a PCB, in accordance with some embodiments.

FIG. 14 is an example process flow diagram for providing a thermal interface for a PCB, in accordance with some embodiments. The process 1400 may comport with embodiments described in reference to FIGS. 1-10 and 11-13 of this disclosure.

The process 1400 may begin at block 1402 and include disposing a thermal interface between a PCB and a thermal solution, such as a heat sink. Disposing the thermal interface may include disposing a socket on the PCB, providing a substrate in the socket, disposing an integrated circuit (e.g., CPU) with an integrated heat spreader (IHS) on the substrate, and disposing a thermal interface material comprising the thermal interface on the IHS or on a surface of a base of the heat sink facing the integrated circuit with the IHS.

At block 1404, the process 1400 may include attaching the heat sink to the PCB.

At block 1406, the process 1400 may include attaching a heater block to a base of the heat sink via a plurality of heat pipes couplable to the heater block and the heat sink. In some embodiments, the heat pipes may be attached to (e.g., embedded in) the base and coupling the heater block to the base may include connecting the heater block to the heat pipes.

In some embodiments, the heat pipes may be attached to (e.g., embedded in) the heater block and coupling the heater block to the base may include connecting the heat pipes to the base.

At block 1408, the process 1400 may include applying heat to the thermal interface, which may include causing the heater block to provide heat to the base, to provide a soldering of the thermal interface.

At block 1410, the process 1410 may include disconnecting the heater block from the base, after the thermal interface reached a melting condition.

The embodiments described herein may be further illustrated by the following examples.

Example 1 may be a system, comprising: a heat sink couplable to a printed circuit board (PCB) via a thermal interface, wherein the heat sink includes a base, wherein the base is to accommodate a plurality of heat pipes; and a heater block couplable to the base with the plurality of heat pipes, to conduct heat generated by the heater block to the base via the plurality of heat pipes, to heat the thermal interface, and cause the thermal interface to spread substantially evenly between the heat sink and the PCB.

Example 2 may include the system of example 1, wherein the base includes a plurality of receptors to receive respective heat pipes of the plurality of heat pipes.

Example 3 may include the system of example 1, wherein the heat pipes are attached to the base, wherein the heat pipes have respective extended portions that extend out of the base, and wherein the heater block is removably attachable to the base via the extended portions of the heat pipes.

Example 4 may include the system of example 2, wherein the heat pipes are attached to the heater block, wherein the heat pipes have respective extended portions that extend out of the heater block and wherein the heater block is removably attachable to the base via the extended portions of the heat pipes.

Example 5 may include the system of example 3, wherein the plurality of receptors comprises multiple grooves provided on a surface of a side of the base that is to face the thermal interface, in response to attachment of the heat sink to the PCB.

Example 6 may include the system of example 2, wherein the plurality of receptors comprises multiple holes disposed in a side of the base that is to face the thermal interface, in response to attachment of the heat sink to the PCB.

Example 7 may include the system of example 1, wherein the thermal interface comprises a thermal interface material (TIM), wherein the TIM includes a thermal conductive soldered paste, wherein the heat pipes conduct the heat to the base to cause the paste to reflow, to reduce thermal resistance between at least a portion of the PCB and the heat sink, in response to a coupling of the heat sink to the portion of the PCB.

Example 8 may include the system of example 7, further comprising: a socket disposed in the portion of the PCB; a substrate disposed in the socket; and an integrated circuit with an integrated heat spreader (IHS) disposed on the substrate, wherein the thermal interface material is disposed on the IHS, to provide the thermal interface between the heat sink and the integrated circuit, in response to the coupling of the heat sink to the portion of the PCB.

Example 9 may include the system of example 8, wherein the PCB comprises a motherboard, wherein the integrated circuit comprises a central processing unit (CPU).

Example 10 may include the system of any examples 1 to 9, wherein the heat pipes are to operate at a temperature equal to or exceeding 200 degrees Celsius.

Example 11 may be a method for providing a thermal interface in a printed circuit board (PCB), comprising: disposing the thermal interface between the PCB and a heat sink; attaching a heater block to a base of the heat sink via a plurality of heat pipes couplable to the heater block and the heat sink; and applying heat to the thermal interface, wherein applying heat includes causing the heater block to provide heat to the base, to provide a soldering of the thermal interface, to cause a substantially even spreading of the thermal interface between the base and the PCB.

Example 12 may include the method of example 11, further comprising: attaching the heat sink to the PCB.

Example 13 may include the method of example 11, wherein providing the thermal interface includes: providing a substrate; disposing an integrated circuit with an integrated heat spreader (IHS) on the substrate; and disposing a thermal interface material on the IHS or on a side of the heat sink facing the IHS.

Example 14 may include the method of any examples 11 to 13, wherein the heat pipes are attached to the base, wherein coupling a heater block to a base of the heat sink via a plurality of heat pipes includes connecting the heater block to the heat pipes.

Example 15 may include the method of any examples 11 to 13, wherein the heat pipes are attached to the heater block, wherein coupling a heater block to a base of the heat sink via a plurality of heat pipes includes connecting the heat pipes to the base.

Example 16 may include the method of example 13, further comprising: disconnecting the heater block from the base.

Example 17 may be a system, comprising: a heat sink couplable to a printed circuit board (PCB) via a thermal interface, wherein the heat sink includes a base and a heat exchanger disposed on the base; and a heater block having a heat conductive component couplable with the heat exchanger of the heat sink, to conduct heat generated by the heater block to the base of the heat sink, to heat the thermal interface, and cause the thermal interface to spread substantially evenly between the heat sink and the PCB.

Example 18 may include the system of example 17, wherein the heat exchanger comprises a first plurality of fins, wherein the heat conductive component of the heater block comprises a second plurality of fins, arranged to receive the first plurality of fins, in response to attachment of the heater block to the heat sink.

Example 19 may include the system of example 18, wherein the fins of the heat conductive component are insertable into corresponding spaces between the fins of the heat exchanger.

Example 20 may include the system of any examples 17 to 19, wherein the heat exchanger comprises a first plurality of pins, wherein the heat conductive component of the heater block comprises a second plurality of pins, arranged to interact with the first plurality of pins, in response to attachment of the heater block to the heat sink.

Example 21 may include the system of any examples 17 to 19, wherein the thermal interface comprises a thermal interface material (TIM), wherein the TIM includes a thermal conductive soldered paste, wherein the heat conductive component is to conduct the heat to the base, to cause the paste to reflow, to reduce thermal resistance between at least a portion of the PCB and the heat sink, in response to a coupling of the heat sink to the portion of the PCB.

Example 22 may include the system of example 21, further comprising: a socket disposed in the portion of the PCB; a substrate disposed in the socket; and an integrated circuit with an integrated heat spreader (IHS) disposed on the substrate, wherein the thermal interface material is disposed on the IHS, to provide the thermal interface between the heat sink and the integrated circuit, in response to the coupling of the heat sink to the portion of the PCB.

Example 23 may include the system of example 22, wherein the integrated circuit comprises a central processing unit, wherein the PCB comprises a motherboard.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A system, comprising:
a heat sink couplable to a printed circuit board (PCB) via a thermal interface, wherein the thermal interface comprises a thermal interface material (TIM), wherein the TIM includes a thermal conductive soldered paste, wherein the heat sink includes a base, wherein the base is to accommodate a plurality of heat pipes; and
a heater block couplable to the base with the plurality of heat pipes, to conduct heat generated by the heater block to the base via the plurality of heat pipes, to heat the thermal interface, and cause the thermal interface to spread substantially evenly between the heat sink and the PCB, wherein the heat pipes conduct the heat to the base to cause the paste to reflow, to reduce thermal resistance between at least a portion of the PCB and the heat sink, in response to a coupling of the heat sink to the portion of the PCB.

2. The system of claim 1, wherein the base includes a plurality of receptors to receive respective heat pipes of the plurality of heat pipes.

3. The system of claim 2, wherein the heat pipes are attached to the heater block, wherein the heat pipes have respective extended portions that extend out of the heater block and wherein the heater block is removably attachable to the base via the extended portions of the heat pipes.

4. The system of claim 2, wherein the plurality of receptors comprises multiple grooves provided on a surface of a side of the base that is to face the thermal interface, in response to attachment of the heat sink to the PCB.

5. The system of claim 2, wherein the plurality of receptors comprises multiple holes disposed in a side of the base that is to face the thermal interface, in response to attachment of the heat sink to the PCB.

6. The system of claim 1, wherein the heat pipes are attached to the base, wherein the heat pipes have respective extended portions that extend out of the base, and wherein the heater block is removably attachable to the base via the extended portions of the heat pipes.

7. The system of claim 1, further comprising:
a socket disposed in the portion of the PCB;
a substrate disposed in the socket; and
an integrated circuit with an integrated heat spreader (IHS) disposed on the substrate, wherein the thermal interface material is disposed on the IHS, to provide the thermal interface between the heat sink and the integrated circuit, in response to the coupling of the heat sink to the portion of the PCB.

8. The system of claim 7, wherein the PCB comprises a motherboard, wherein the integrated circuit comprises a central processing unit (CPU).

9. The system of claim 1, wherein the heat pipes are to operate at a temperature equal to or exceeding 200 degrees Celsius.

10. A method, comprising:
disposing a thermal interface between a printed circuit board (PCB) and a heat sink, the thermal interface comprising a thermal interface material (TIM), wherein the TIM includes a thermal conductive soldered paste;
attaching a heater block to a base of the heat sink via a plurality of heat pipes couplable to the heater block and the heat sink; and
applying heat to the thermal interface, wherein applying heat includes causing the heat pipes of the heater block to provide heat to the base to cause the paste to reflow, to provide a soldering of the thermal interface, to cause a substantially even spreading of the thermal interface between the base and the PCB and to reduce thermal resistance between at least a portion of the PCB and the heat sink, in response to a coupling of the heat sink to the portion of the PCB.

11. The method of claim 10, further comprising: attaching the heat sink to the PCB.

12. The method of claim 10, wherein providing the thermal interface includes:
providing a substrate;
disposing an integrated circuit with an integrated heat spreader (IHS) on the substrate; and
disposing a thermal interface material on the IHS or on a side of the heat sink facing the IHS.

13. The method of claim 12, further comprising: disconnecting the heater block from the base.

14. The method of claim 10, wherein the heat pipes are attached to the base, wherein coupling a heater block to a base of the heat sink via a plurality of heat pipes includes connecting the heater block to the heat pipes.

15. The method of claim 10, wherein the heat pipes are attached to the heater block, wherein coupling a heater block to a base of the heat sink via a plurality of heat pipes includes connecting the heat pipes to the base.

* * * * *